(12) United States Patent
Sheats

(10) Patent No.: US 7,964,964 B2
(45) Date of Patent: Jun. 21, 2011

(54) METHOD OF PACKAGING AND INTERCONNECTION OF INTEGRATED CIRCUITS

(76) Inventor: James Sheats, Palo Alto, CA (US)

( * ) Notice: Subject to any disclaimer, the term of this patent is extended or adjusted under 35 U.S.C. 154(b) by 0 days.

(21) Appl. No.: 12/582,940

(22) Filed: Oct. 21, 2009

(65) Prior Publication Data

US 2010/0038770 A1 Feb. 18, 2010

Related U.S. Application Data

(62) Division of application No. 11/206,605, filed on Aug. 18, 2005, now Pat. No. 7,618,844.

(51) Int. Cl.
*H01L 23/52* (2006.01)
*H01L 23/48* (2006.01)
*H01L 29/40* (2006.01)
*H01L 23/485* (2006.01)
*H01L 23/488* (2006.01)

(52) U.S. Cl. . 257/737; 257/779; 257/780; 257/E23.021; 257/E23.023

(58) Field of Classification Search .................. 257/737, 257/779, 780, E23.021, E23.023
See application file for complete search history.

(56) References Cited

U.S. PATENT DOCUMENTS

| | | | |
|---|---|---|---|
| 5,053,195 A | | 10/1991 | McKay |
| 5,196,726 A | * | 3/1993 | Nishiguchi et al. ........... 257/737 |
| 5,225,157 A | | 7/1993 | McKay |
| 5,406,025 A | | 4/1995 | Carlstedt |
| 5,672,913 A | | 9/1997 | Baldwin et al. |
| 5,956,235 A | * | 9/1999 | Kresge et al. ................ 361/774 |
| 6,008,542 A | * | 12/1999 | Takamori ...................... 257/773 |
| 6,042,391 A | * | 3/2000 | Bodo et al. ...................... 439/74 |
| 6,114,221 A | * | 9/2000 | Tonti et al. .................... 438/455 |
| 6,323,058 B1 | * | 11/2001 | Murakamz et al. ........... 438/106 |
| 6,410,415 B1 | * | 6/2002 | Estes et al. .................... 438/612 |
| 6,495,441 B2 | | 12/2002 | Kitajima et al. |
| 6,554,923 B2 | | 4/2003 | Bhattacharya et al. |
| 2002/0050652 A1 | * | 5/2002 | Akram et al. ................. 257/783 |
| 2002/0142575 A1 | * | 10/2002 | Lee ............................... 438/613 |

\* cited by examiner

*Primary Examiner* — Luan C Thai
(74) *Attorney, Agent, or Firm* — Tue Nguyen

(57) ABSTRACT

A semiconductor chip packaging on a flexible substrate is disclosed. The chip and the flexible substrate are provided with corresponding raised and indented micron-scale contact pads with the indented contact pads partially filled with a liquid amalgam. After low temperature amalgam curing, the chip and the substrate form a flexible substrate IC packaging with high conductivity, controllable interface layer thickness, micron-scale contact density and low process temperature. Adhesion between the chip and the substrate can be further enhanced by coating other areas with non-conducting adhesive.

20 Claims, 12 Drawing Sheets

METHOD OF PACKAGING AND INTERCONNECTION OF INTEGRATED CIRCUITS

This application is a continuation of application Ser. No. 11/206,605, filing date Aug. 18, 2005, entitled "Method of packaging and interconnection of integrated circuits".

FIELD OF THE INVENTION

The present invention is related generally to electronics packaging and, more particularly to packaging and interconnection of integrated circuits on a flexible substrate.

BACKGROUND OF THE INVENTION

Board level semiconductor packaging and interconnection of integrated circuits (IC) is the process to electrically connect the IC chips to each other and to external circuitry to function as an electronic system. The IC chips have input and output contact pads and the interconnection is typically an array of metallic connections within a support substrate. The normal packaging process of forming a fully functional product based on integrated circuits usually includes placing the semiconductor IC chips on a printed circuit board (PCB) and soldering their contact pads to contact pads on the PCB. Several connection techniques are widely used and well known in the art. These include wire bonding, tape automated bonding (TAB), flip-chip bonding, etc.

The earliest process is wire bonding, the process of placing the ICs face up on the PCB, and bonding fine wire conductors from the IC contact pads to the PCB pads. Wire bonding is by far the most common and economical connection technique, usually by thermocompression, thermosonic or ultrasonic processes. Because wire bonding requires wires to be welded to the chip, there must be adequate space to accommodate the wires.

This technique is appropriate to the use of solid PCBs and rigid ICs, formed by dicing silicon wafers that are typically 0.5 mm thick. It is desirable for many applications to have flexible electronic products, for example flexible display backplanes, in which case the PCB must be replaced by a printed circuit tape (PCT), often known in the industry as a "flex circuit". In addition, the integrated circuit must be flexible. Flexible integrated circuits can be fabricated by direct deposition and patterning of semiconductor and other materials to form interconnected transistors on plastic (or other flexible substrate). However, the performance of such devices tends to be less than optimal, and the processes for fabricating them less well developed and more costly than for the well-known processes of fabricating transistors in silicon wafers.

TAB utilizes patterned metal on a polymeric tape to join the chips together, involving bonding gold-bumped pads on the chips to external circuitry. TAB requires mechanical force such as pressure or a burst of ultrasonic vibration and elevated temperature to accomplish the welding between the wires or bumps and the designated surface.

One way to obtain higher performance flexible circuits at affordable cost is to thin conventional wafers until they are flexible. It is now common in the industry to produce wafers thinner than 100 microns, and as thin as 20 microns or less, by a combination of grinding, polishing, and etching, and these processes add a modest fraction to the cost of the ICs. In principle, these very thin wafers (which are now quite flexible) may be diced and mounted on flexible substrates, resulting in flexible products. In practice, many problems arise in the handling of such thin (and therefore delicate) chips.

One approach, a process called Fluidic Self-Assembly, attempts to address these issues by mechanically indenting a polymer substrate to approximately the thickness of a thinned silicon chip having contact pads, which then is inserted into the depression. However, apart from the possibility of defects arising from incomplete filling of the holes, this process does not result in a highly planar surface due to variations in the thickness of chips coupled with variations in the depth of the depressions, and there is still a small but significant gap between the side of the chip and the side of the hole. This leads to complexity in forming the subsequent interconnect metallization. It also does not address the issue of reliability due to mismatched thermal expansions.

Another possible approach to these problems is to apply, by lamination or casting followed by lithography, a thin film of polymer with cutouts that are the right size into which to insert the thinned ICs. This process could be low cost and high speed. However, as with the Fluidic Self-Assembly process, there would still be imperfections in the coplanarity due to the inevitable variations, and there would still be a gap between the sides of the chip and the side of the cutout.

The increase in density of input/output (I/O) lines caused the industry to shift to so-called "flip-chip" methods, in which the IC is placed on the PCB face down, and a direct metal-to-metal contact is made between the pads. Most commonly, this is some variant of a process in which a low-melting metal (solder) is first placed on the pads of one member (for example by dipping into a container of liquid metal, after the surface has been treated in such a way that solder will adhere only to the pads), forming solder "bumps". The other member also has "bumps" formed on the pads; the non-solder bumps are some appropriate metal which must be part of the final lithographic processing step. The IC is placed on the PCB by a pick-and-place machine with enough accuracy to orient the solder bumps over the correct locations, and with sufficient heat to liquefy the solder, a strong metal-metal connection is then made. The empty space between connections is filled ("underfilled") with epoxy so as to strengthen the adhesion and prevent failure due to corrosion of the metal and to mechanical stress from heating/cooling cycles and the mismatch of coefficients of thermal expansion (CTE) between the IC and the PCB.

A major advantage of flip-chip bonding over wire bonding and TAB is that the connection paths are shorter, and therefore have better electrical characteristics. In addition, flip-chip bonding requires minimal mounting area which results in further overall cost saving. However, while flip-chip technology has tremendous advantages over wire bonding and TAB, its cost and technical limitations are significant. For example, the cost of forming bumps on the pads is high, and the underfilling process of an adhesive between the chip and the support substrate increases both manufacturing complexity and cost. Furthermore, the solder joints exhibit increased electrical resistance as well as cracks and voids over time due to fatigue from thermo-mechanical stresses. Finally, the solder is typically high temperature, which is not suitable to flexible substrate.

SUMMARY OF THE INVENTION

The present invention provides a low temperature, high density IC flip chip packaging concept in which the surface of the IC chip is in intimate contact with the surface of the substrate. The IC packaging process of the present invention is based on the use of amalgams, which are mixtures of metallic elements that are liquid when first mixed, but which harden into high-melting metallic solids upon curing. In the present invention, one substrate is provided with raised contact pads, and the other substrate is provided with indentations at the locations corresponding to the locations of the raised pads. These indentations are partially filled with amalgam, and then the two substrates are laminated together, so that the raised contact pads fit into the indented contact pads, and the surfaces of the raised contact pads are immersed in the liquid. The laminate is then cured to provide solid contacts. Adhesion between the two substrates may be enhanced by coating other areas away from the contact pads with non-conducting adhesive.

Because the raised contact pads have been constructed so as to fit entirely within the wells, and they initially contact only liquid, the two substrates can have no separation at all. Further, high density chip packaging is possible with contact pads having micron or submicron sizes. Thus the present invention provides a method of connecting metal contact pads embedded in two different flexible substrates that provides high (metallic) conductivity, low and controllable interlayer thickness so that good adhesion can be provided by intimate contact, high lateral density of contacts down to the micron or submicron scale, and low process temperature.

The invention is not limited to a single connection of two substrates or a flip chip connection to a substrate. Bottom contacts or through contacts can be made through via opening by convention fabrication methods such as photolithography and etching, or laser ablation. And since the structure is highly planar, it is simple to add a dielectric layer on top of the first interconnect layer, and then a second interconnect layer with interconnection through vias.

DETAIL DESCRIPTION OF THE INVENTION

Figure 1A:
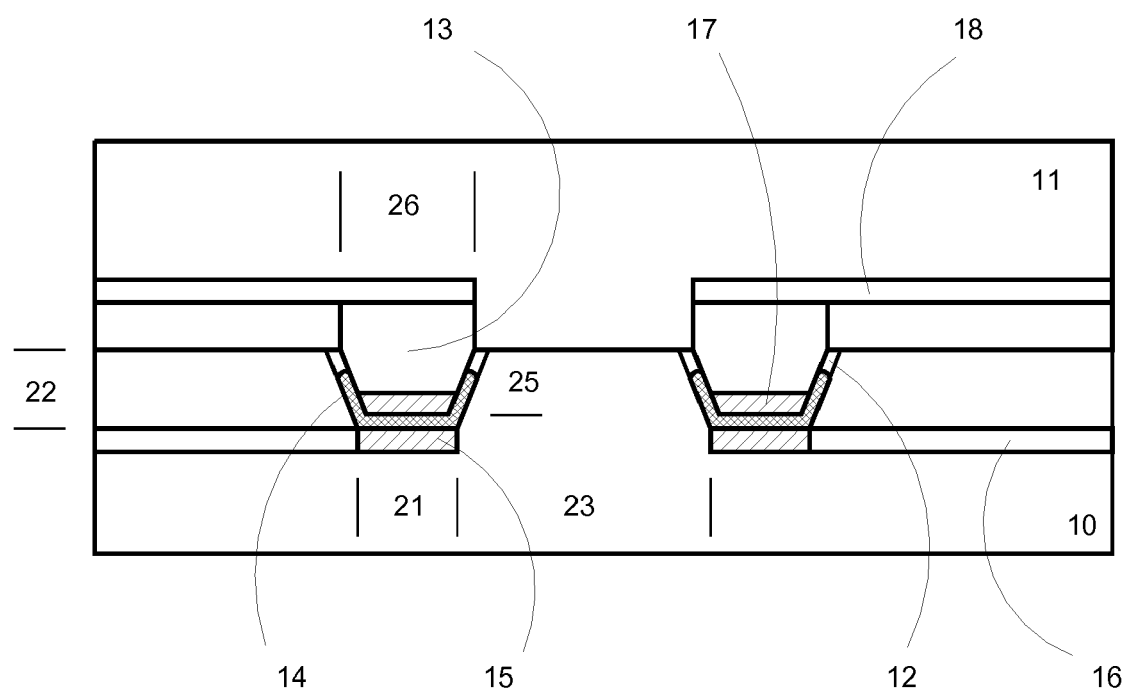
FIGS. 1A-1E show various embodiments of the structure of the present invention flexible chip packaging.

The present invention provides a novel IC packaging concept for flip chip packaging and substrate lamination. The present invention provides the ability to bond chips face down onto connection pads, in a manner similar to conventional flip-chip bonding (see FIGS. 1A-1C). Alternatively, the present invention packaging process can laminate two circuitry-bearing substrates together, one of which bears chips, with a third film in between, and have electrical connections between the two substrates (see FIGS. 1D-1E). The contact density can be micron-scale density, since the separation between the two substrates (or between the surfaces of the chips and the mating substrate) can be as small as desired, perhaps as small as one micron or less, and the contact pads can have a lateral size of the order of one micron and spacing between pads of the order of one micron. These capabilities provide significant advantages over conventional flip chip technology.

Further, the present invention packaging process provides a low temperature method of interconnecting which does not require heating to temperatures above the melting temperature (and preferably not above the glass transition temperature) of the plastic substrates, which may be in the range of 100-300° C. The solder currently used in conventional flip-chip processes melts at about 300° C. or higher, and even most so-called low-melting solders do not melt below about 200-250° C. Most methods of low temperature interconnection also have various disadvantages. For example, conductive adhesives, generally made by mixing metal particles (often silver flakes) into a curable polymer binder, are often used to make connections at lower process temperatures; these may be isotropic or anisotropic conducting adhesives. However, they tend to have substantially higher resistance because of the poorly conducting boundaries between metal particles. In addition, the size of the particles (typically greater than 1 micron, and in the case of available anisotropic conductive adhesives much greater) makes them less suitable for applications involving high densities of interconnects or very close fits between substrates. Another low temperature interconnection is cold welding, in which two chemically pure, unoxidized or corroded metal surfaces are pushed into intimate contact, may be used to fuse two metals tightly together. However, it is in practice difficult to get most metals into this condition, and even then they will not make as good electrical contact as a soldered contact, because there will always be roughness on the submicroscopic scale, which will prevent two hard metals from making perfect contact over most of their surface area. A separation of more than a few tenths of a nanometer (a few atomic diameters) is sufficient to drastically lower the conductivity. The only exception known is gold, which when deposited in a thin layer (20 nm) on a compliant substrate such as polydimethylsiloxane appears to make good contact to another such thin layer under modest pressure.

The present invention provides a method of connecting metal contact pads embedded in two different articles, preferably two different flexible substrates or a semiconductor chip and a flexible substrate, in a way which satisfies the stringent requirements of IC packaging: it affords high (metallic) conductivity at low process temperature, similar in conductivity to solder connections; low and controllable interlayer thickness (down to the micron or submicron level) so that good adhesion can be provided by intimate contact (through a thin adhesive layer) of the flexible substrates; high lateral density of contacts, down to the micron scale (limited only by the ability to correctly align the two substrates); and low process temperature.

The preferred embodiment of the invention is based on the use of amalgams, which are mixtures of metallic elements that are liquid when first mixed, but which harden into high-melting metallic solids upon curing. Curing may take place at room temperature, or be accelerated by higher temperatures. The amalgams of interest are those which include gallium and mercury as the liquid metal, but gallium is preferred since mercury is toxic and undesirable to handle. Gallium amalgams have been used for integrated circuit contacts, but the present invention presents a novel way of contact in which the contacts are of micron or submicron size (0.1-50 µm) instead of conventional size of 100 µm or higher; the contact pads use amalgam for bonding, not conventional solder bumps; and there is no (or controllable) spacing between the chip and the substrate, instead of many microns spacing in conventional process which must be underfilled with epoxy. Further, due to the small size of the contact pads, the amalgam delivery is typically a controlled droplet dispenser method of femtoliter to picoliter droplets instead of a screen printer for relatively thick films.

Figure 2A:
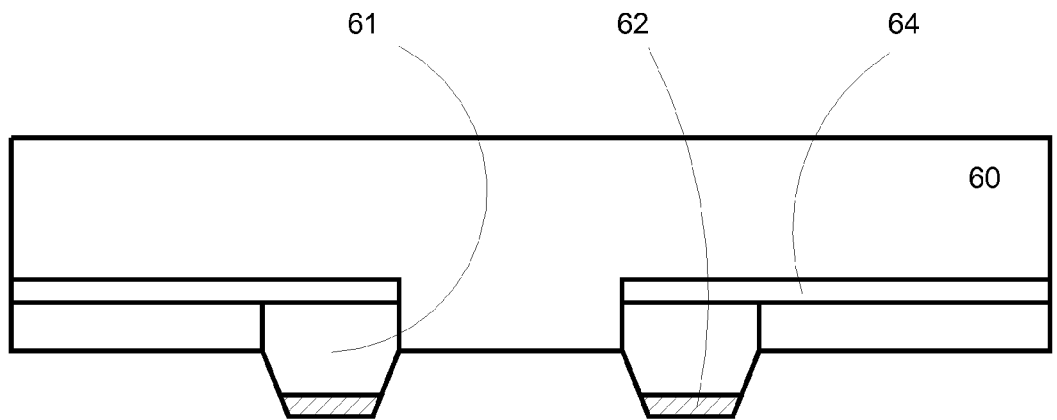
FIGS. 2A-2D show a fabrication process of the present invention chip packaging.

In the present invention, one surface is provided with raised contact pads of a defined thickness and a particular shape (see FIG. 2A). The thickness may be any thickness desired; preferably in the range of 1 to 50 microns, but more or less is possible. The pad may be hemispherical or have sharp (e.g. square) edges, or it may be irregular but confined within a specific perimeter. These pads can be produced in a variety of ways based on techniques common in the semiconductor industry. Thus in some cases the metal surface of the pad at the end of the normal IC fabrication process will serve as the catalyst for electroless deposition, or other selective chemical deposition process (e.g. chemical vapor deposition) which can provide a thicker pad. The raised pads can also be made by depositing suitable metals and etching them after forming a mask by photolithography, or by various printing techniques. They may also be produced by spatially selective irradiation of a metal-containing film followed by selective buildup (by for example electroless plating) of metal in only the irradiated areas. They may also be produced by spatially selective irradiation of a polymer film, thereby exposing (possibly after chemical development) a metal which serves as the catalyst for further buildup by electroless deposition.

The other surface (see FIG. 2B) is provided with indentations at the locations corresponding to the locations of the raised pads; the size of the indentations is such that the pad will fit into them with some room to spare (both laterally and vertically). This indentation is most readily provided by coating the substrate with a curable polymer, for example a polyimide, and opening (by photodefinition, using a photosensitive polyimide for example, or by lithographic patterning) vias over the metal pads underneath so that the depth and lateral size of the indentation can be precisely controlled. Other dielectric thin films (organic or inorganic) may be used in the same way.

These indentations are partially filled with amalgam (see FIG. 2C) using a printing technique. Controlled droplet dispensing methods such as inkjet printing, nano-"dip-pen" printing, or any other printing technique capable of transferring an amount of liquid in the range of 1 femtoliter (the amount required for a 1 square micron contact well, 1 micron deep) up to many picoliters, are suitable. Offset printing and related techniques, in which a liquid is attracted by surface tension to a printing plate or roll and transferred to the substrate by contacting it are also well suited to this process.

Figure 2B:
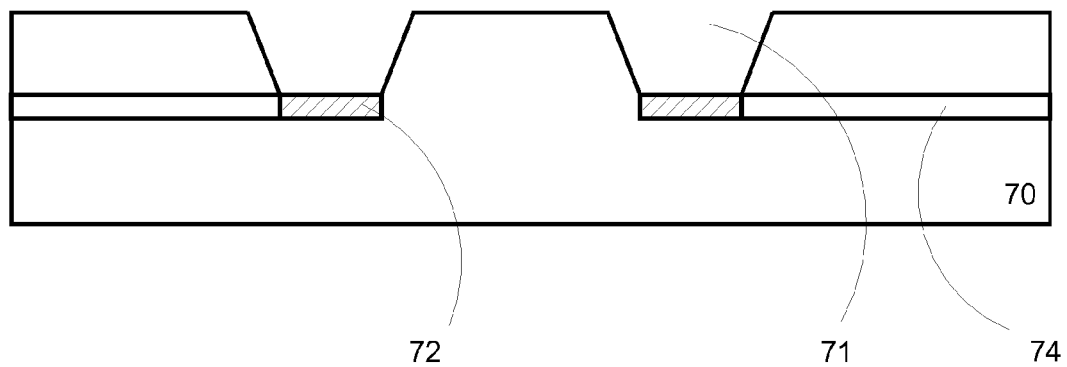
Figure 2C:
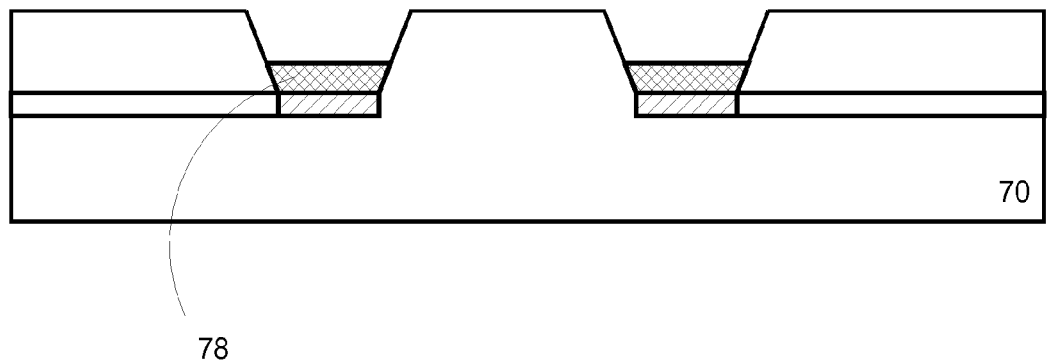
Figure 2D:
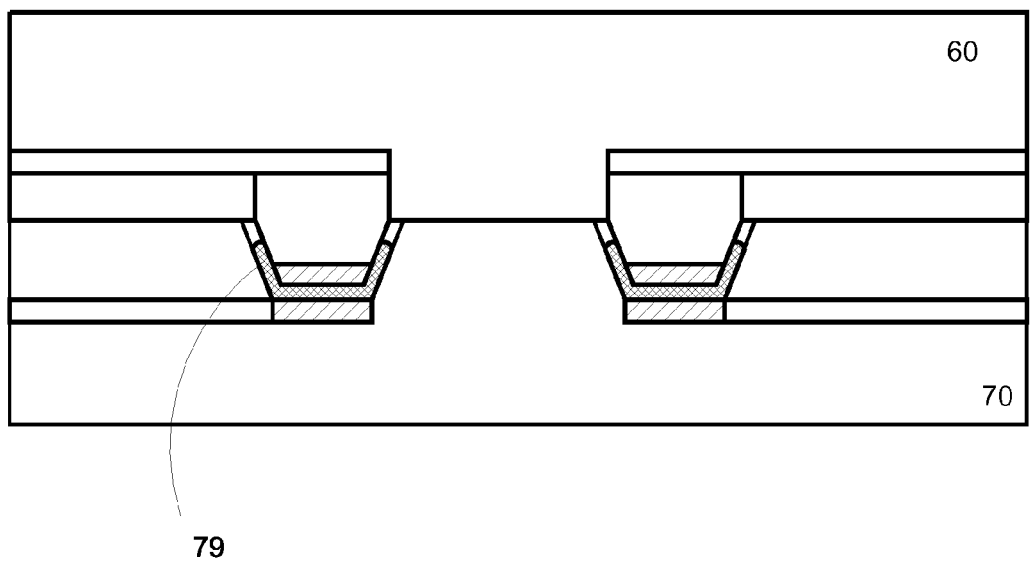

As soon as the amalgam has been placed in the well, the two substrates are laminated together, so that the bumps (the raised contact pads) of one fit into the wells (the indented contact pads) of the other, and the surfaces of the bumps are immersed in the liquid (FIG. 2D). The laminate is left under slight tension or compression to cure, or subjected to heat to accelerate curing. Adhesion between the two substrates may be enhanced by coating other areas (away from the pads) with non-conducting adhesive, which may be cured at the same time. The coating of the non-conducting adhesive and the amalgam can conveniently be done in two immediately successive stages much as two or more colors of ink are printed in conventional graphic printing.

Because the bumps have been constructed so as to fit entirely within the wells, and they initially contact only liquid, the two substrates can have no separation at all. Alternatively spacer structures can be used to define a chosen separation which might be desired for other structures.

The volume of the bump is chosen so as to displace some liquid, but not enough to drive it up over the sides of the wells where it might spread laterally and cause shorting from one contact pad to another. By designing the shape or aspect ratio of the bump, one can obtain good contact while allowing for inevitable process variations in the depth of the wells, heights of the bumps, etc.

FIG. 1A shows an embodiment of the structure of the present invention. A substrate 10, preferably a flexible substrate, but which could be any type of substrate, includes a plurality of indented contact pads 12. The indented contact pad 12 has an indented depth 22, an indented width 21, and contact pad surface 15 connected to interconnection 16. The indented contact pads 12 are separated by a separation distance 23. A chip 11 having raised contact pads 13 is bonded to the substrate 10 in the flip chip style. The raised contact pad 13 has a protruding bump height 25, protruding width 26, and contact pad surface 17 connected to interconnect 18. The contact pads 15 and 17 are electrically bonded by an amalgam 14. Typical dimensions (indented depth 22, indented width 21, separation distance 23, protruding height 25, protruding width 26) of the indented and raised contact pads are in order of microns or submicrons. The raised contact pads dimensions are slightly smaller than those of the indented pads to ensure fitting. Furthermore, the gap between the mated contact pads are designed to accommodate the displacement of the amalgam 14.

Figure 1B:
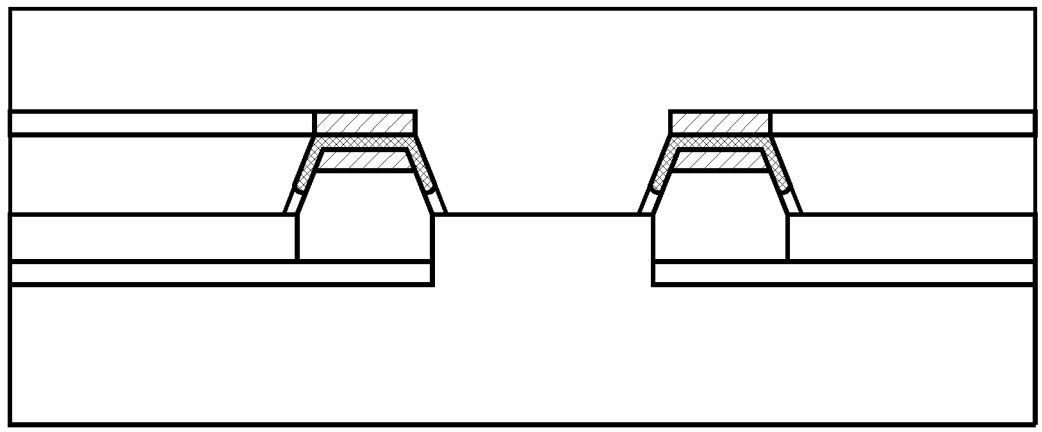
Figure 1C:
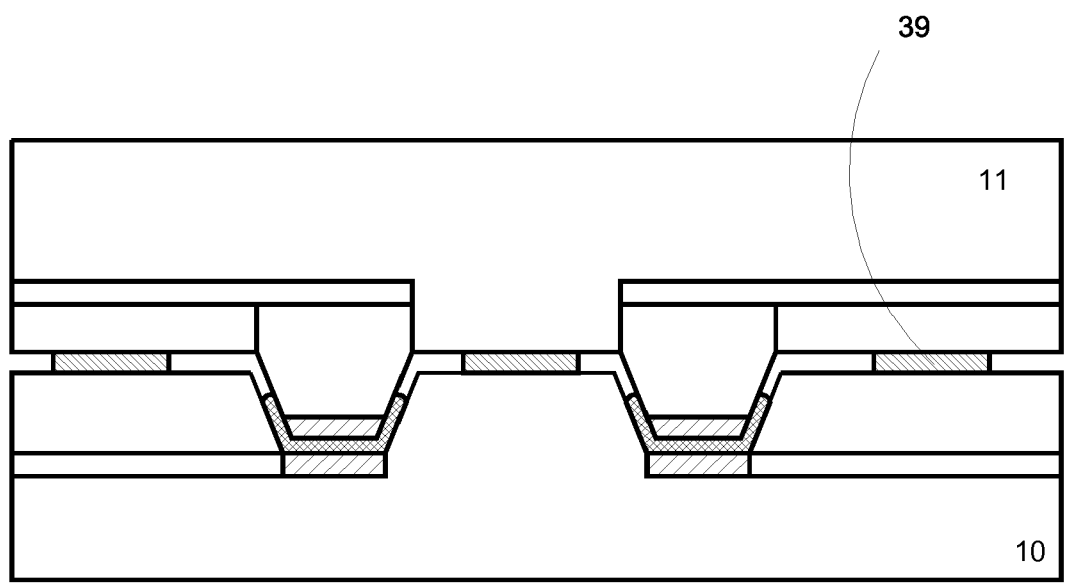

FIG. 1B shows another embodiment of the structure of the present invention with the mated contact pads in reverse locations in which raised contact pads are part of the substrate and indented contact pads are part of the chip. FIG. 1C shows another embodiment of the structure of the present invention with spacer 39 to separate the surfaces of the chip and the substrate.

Figure 1D:
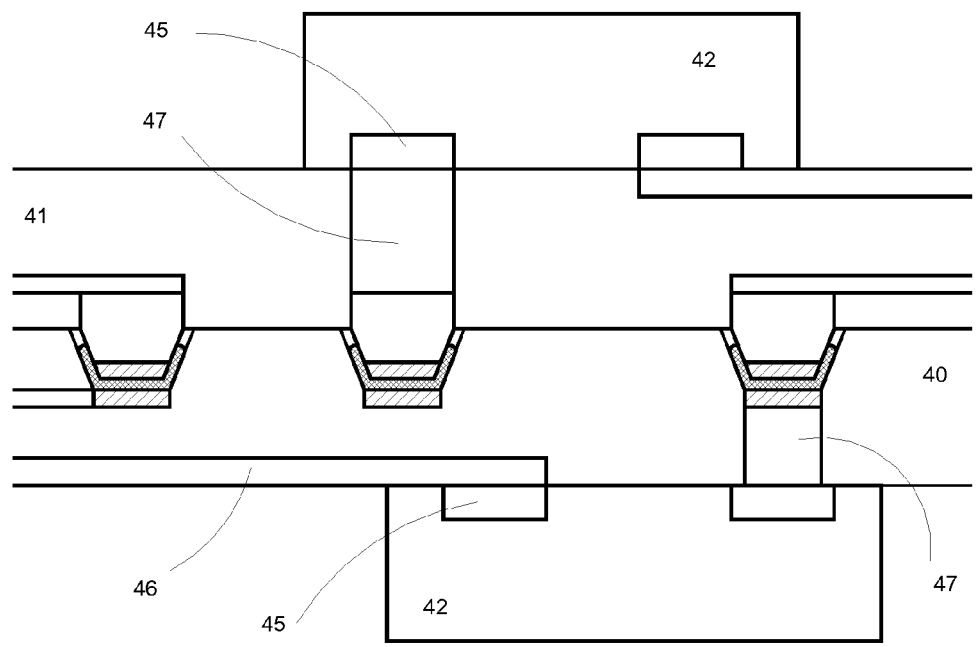

FIG. 1D shows another embodiment of the structure of the present invention between two substrates 40 and 41 with the other surfaces of the substrates containing IC chips 42. The IC chips 42 having contact pads 45 can be bonded to the substrates by the novel flip chip method as described in FIG. 1A or 1B, by any conventional methods, or by a packaging method described in co-pending application "Method of packaging and interconnection of integrated circuits" by the same inventor, hereby incorporated by reference. The substrates can have via contacts 47 connecting between the top and bottom substrates, and interconnect 46 connecting the contact pad of chip 42.

Figure 1E:
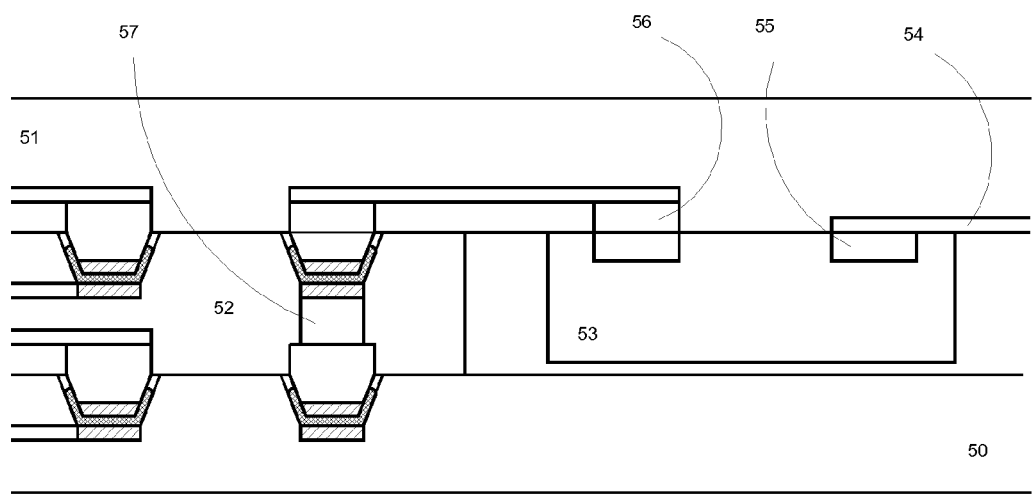

FIG. 1E shows another embodiment of the structure of the present invention between two substrates 50 and 51 with the inner surfaces of the substrates containing IC chips 53 and the inner surfaces of the substrates contacting a third substrate 52. The substrates can have via contacts 57 connecting between the top and bottom substrates, and via 56 for the chip contact pad. Chip 53 also has interconnect 54 connecting from contact pad 55 to a contact pad of another chip (not shown).

FIGS. 2A-2D show a preferred embodiment of the fabrication process of the present invention chip packaging. FIG. 2A shows a top substrate 60 being prepared, including raised contact pads 61. The raised contact pad 61 has contact surface 62 connected to interconnect 64. The interconnection shown is through the contact surface 62 to the interconnect 64, but other ways of contact are also possible, such as via contact.

FIG. 2B shows a bottom substrate 70 being prepared, including indented contact pads 71. The indented contact pad 71 has contact surface 72 connected to interconnect 74. The indented contact pads 71 are then partially filled with a liquid amalgam 78, as shown in FIG. 2C. The substrate 70 is prepared at temperature low enough to keep the liquid amalgam at liquid phase. The top substrate 60 is then laminated onto the substrate 70 with the contact pads mated together. Since the raised contact pads are slightly smaller than the indented contact pads, there is room for the liquid to rise. The whole assembly is then cured, either at room temperature or at a higher temperature to solidify the amalgam composition 79. The top and bottom substrates 60 and 70 are then being packaged with the contact pads 61 and 71 in contact through amalgam contact.

Figure 3A:
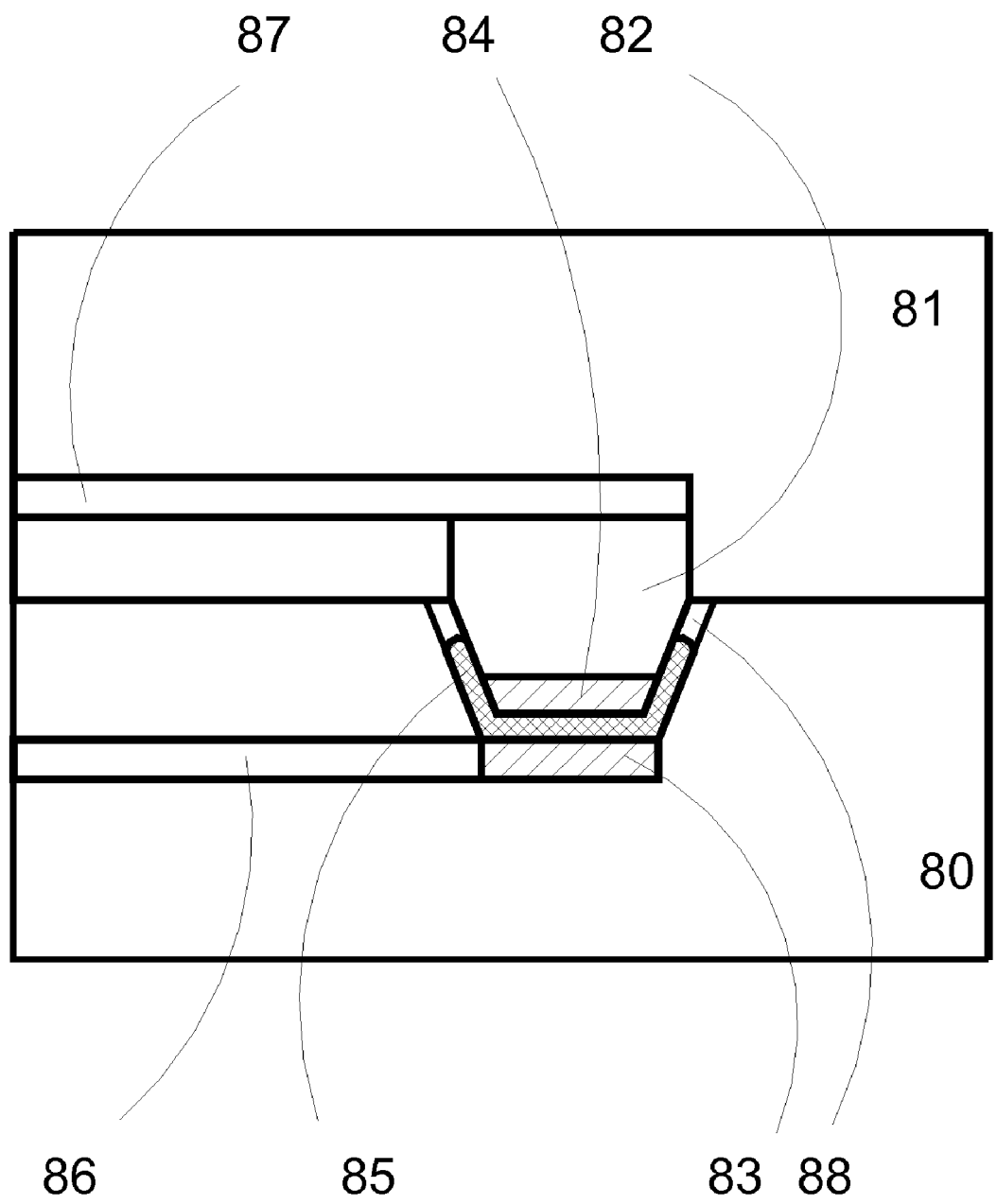
FIGS. 3A-3C show different embodiment of a raised contact pad.
Figure 3B:
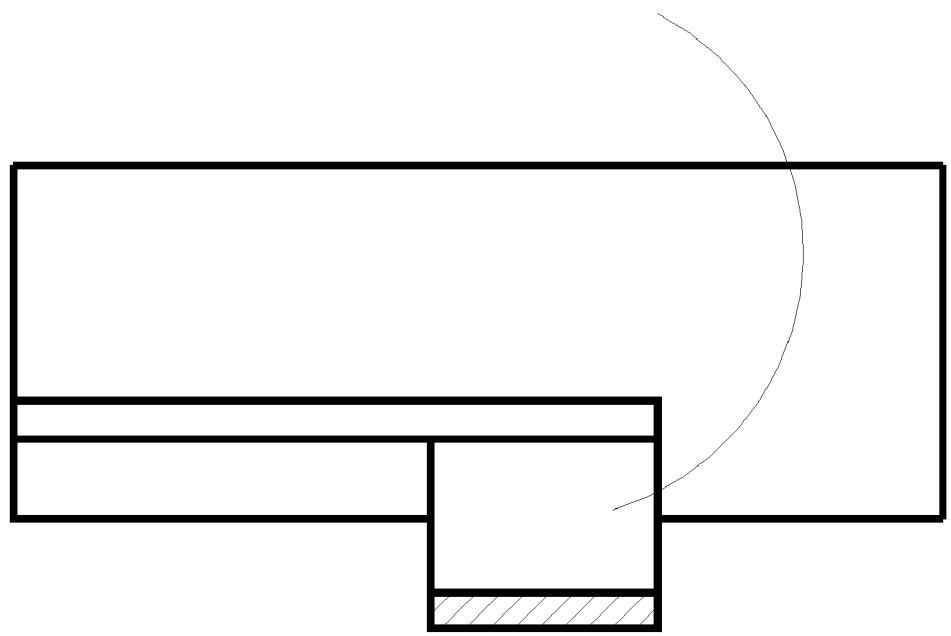
Figure 3C:
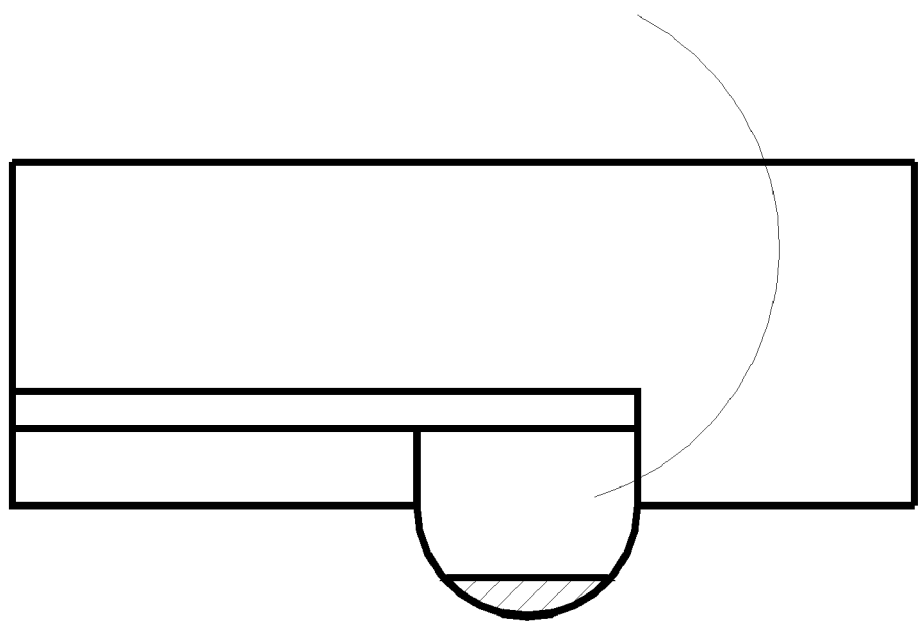

FIG. 3A shows an embodiment of a raised contact pad 82 of a top substrate 81 having a sloped cross section, starting from the contact surface 84 through the interconnect 87. The substrate 81 and the raised contact pad 82 are mated with an indented contact pad 88 of the bottom substrate 80. The interconnect 87 is connected with the raised contact pad 82, to the raised contact surface 84, to the cured amalgam 85, to the indented contact surface 83, to the indented contact pad 88, and finally to the interconnect 86. FIG. 3B and FIG. 3C show other embodiments of the raised contact pad in which the raised contact pad has a rectangular cross section 82B (FIG. 3B) and a hemispherical cross section 82C (FIG. 3C).

Figure 4A:
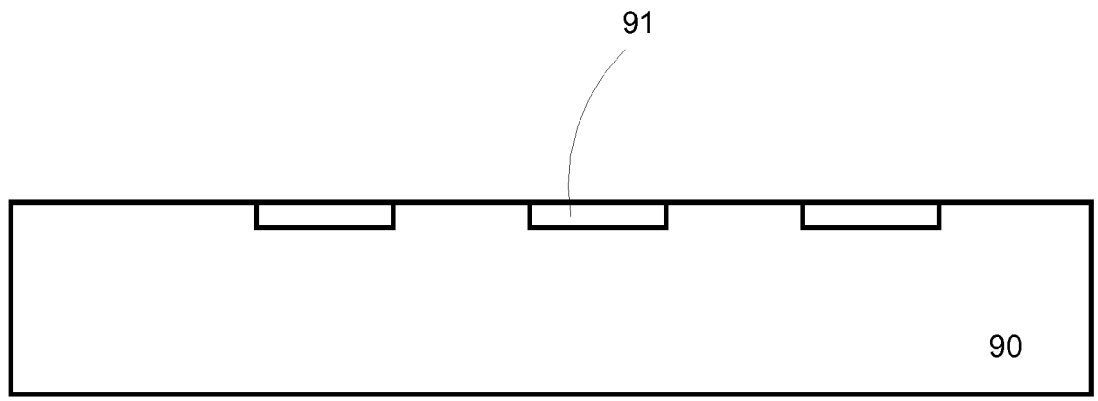
FIGS. 4A-4B show a fabrication process of a raised contact pad.
Figure 4B:
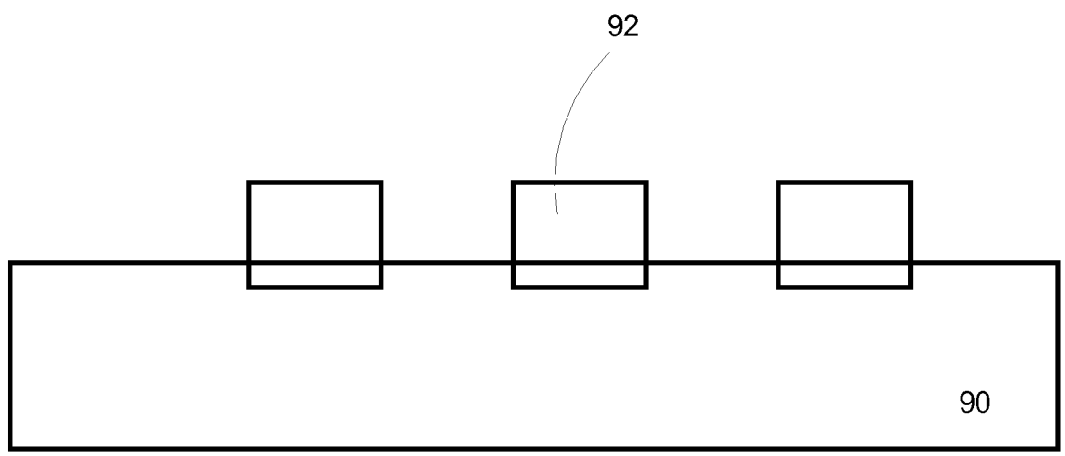

FIGS. 4A-4B show a preferred fabrication process of a raised contact pad employed selective deposition. FIG. 4A shows the starting process with a substrate 90 having contact surfaces 91 and optional interconnection (not shown) prepared. FIG. 4B shows the selective deposition of conductive material 92, such as metal or conductive polymer, onto the contact surfaces 91.

Figure 5A:
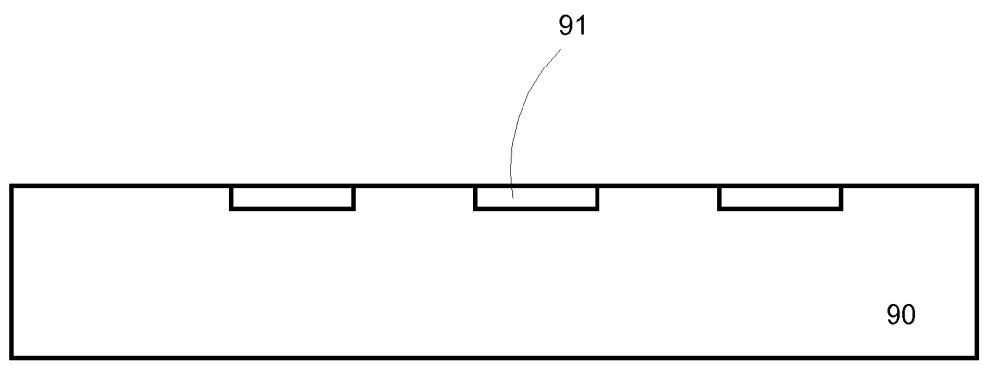
FIGS. 5A-5D show another fabrication process of a raised contact pad.
Figure 5B:
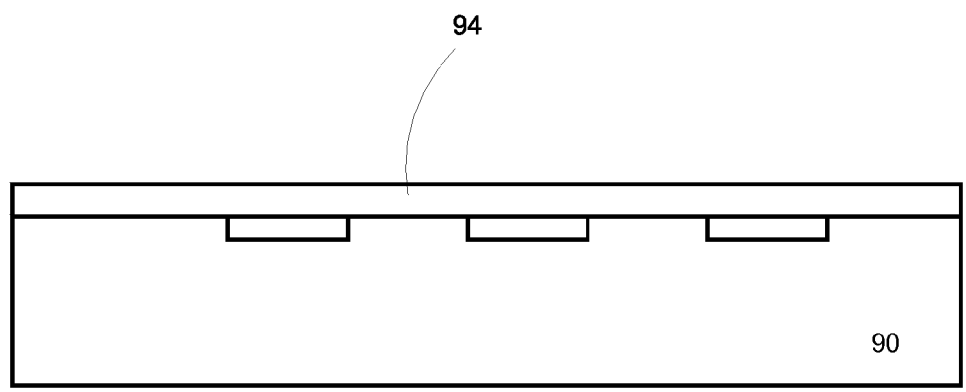
Figure 5C:
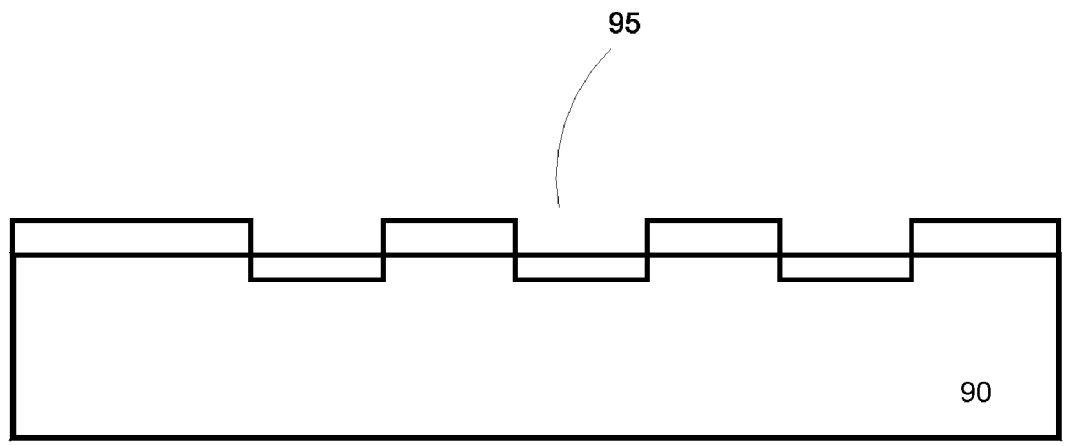
Figure 5D:
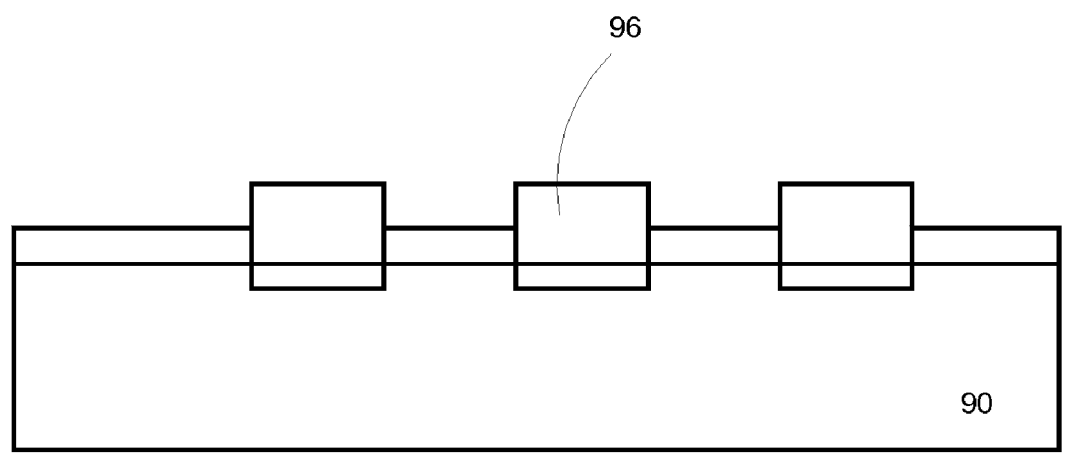

FIGS. 5A-5D show another fabrication process of a raised contact pad, also employed selective deposition. FIG. 5A shows the starting process with a substrate 90 having contact surfaces 91 and optional interconnection (not shown) prepared. FIG. 5B shows a deposition of a non-conducting layer 94, then a patterning process, preferably photolithography process with a photo resist layer 95, to open the non-conducting layer 94 (FIG. 5C). The process continues with the selective deposition of conductive material 96 onto the contact surfaces 91, through the opening in layer 94 and protruding higher (FIG. 5D).

Figure 6A:
FIGS. 6A-6C show another fabrication process of a raised contact pad.
Figure 6B:
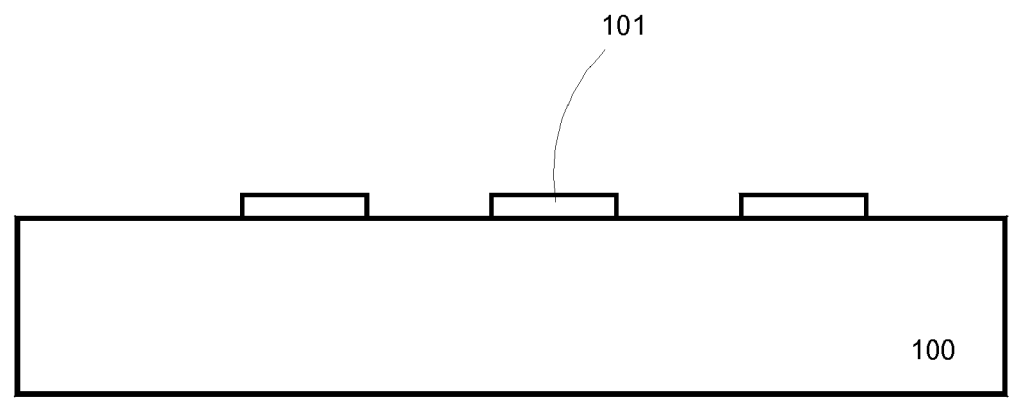
Figure 6C:
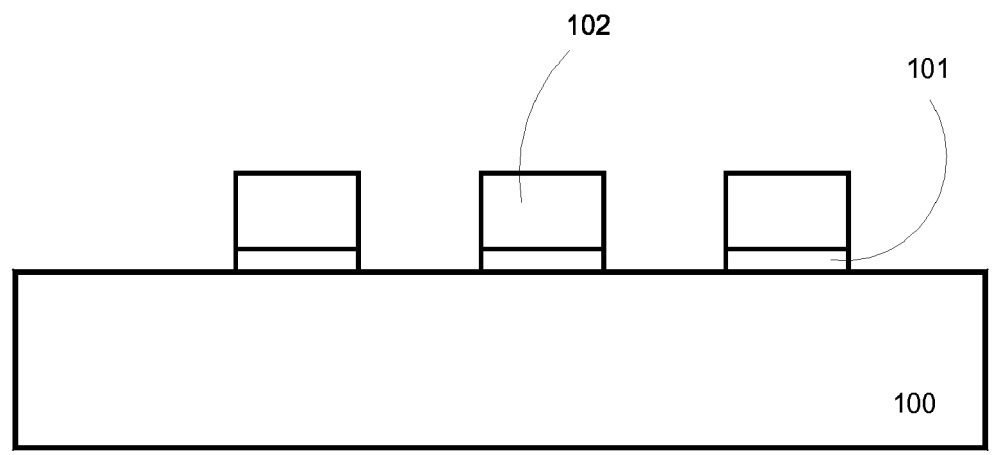

FIGS. 6A-6C show another fabrication process of a raised contact pad, also by selective deposition. FIG. 6A shows a starting substrate 100 without contact pads. Contact pads 101 can be prepared onto the substrate 100 (FIG. 6B), and raised conductive material 102 can be selectively deposited on the contact pads (FIG. 6C).

Figure 7A:
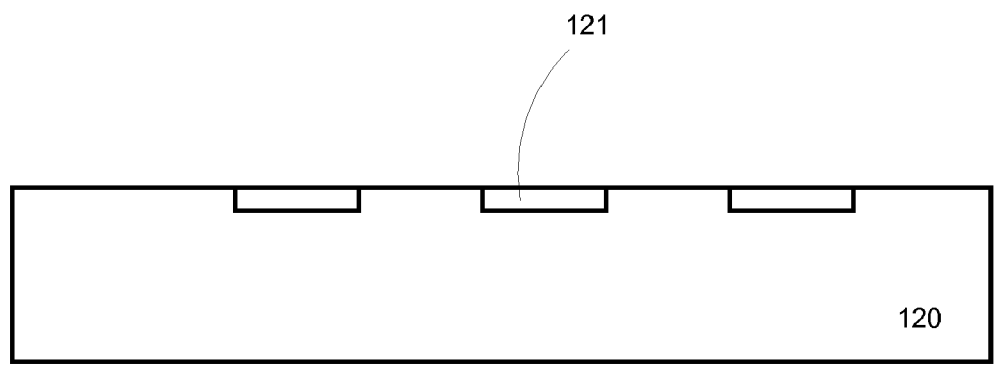
FIGS. 7A-7C show a fabrication process of an indented contact pad.
Figure 7B:
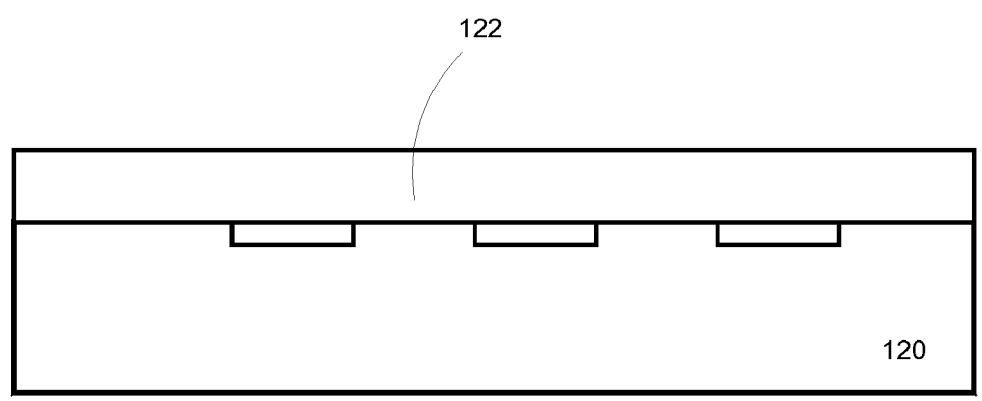
Figure 7C:
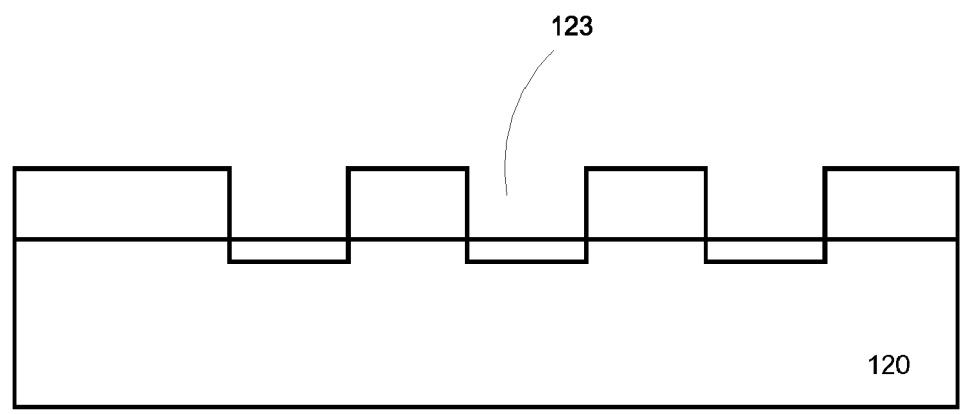

FIGS. 7A-7C show a fabrication process of an indented contact pad. FIG. 7A shows the starting process with a substrate 120 having contact surfaces 121 and optional interconnection (not shown) prepared. A layer of non-conducting material 122 is deposited onto the substrate 120 (FIG. 7B), and then the indented contact pads 123 can be patterned on the non-conducting layer 122, preferably by photolithography (FIG. 7C).

The IC chips may be any types of semiconductor device such as, for example, memory devices, central processing units, signal processing units, controller devices, or any combination of these or other devices. Further, other electronic components can be used instead of IC chips, such as a passive component such as a resistor, capacitor, or inductor, or any other type of electronic component, whether or not implemented as an IC, such as an oscillator, filter, sensor, variable resistor, fuse, or coil. Multilayer interconnect structures, including embedded passives (resistors, capacitors, etc.) or power distribution/ground plane structures can also be provided in this assembly.

The flexible substrate can be any polymeric film, such as polyethylene terephthalate PET, a polyimide film such as Kapton, or a benzocyclobutene (BCB)-based polymer dielectric such as Cyclotene, a resin-impregnated fabric or a synthetic fabric, polyester, polyparabanic acid, epoxy, and fiberglass.

The adhesive can also be a single-piece adhesive or a multiple-piece adhesive. The adhesive can be silicone, polyimide, epoxy, thermoplastic adhesive materials, flexible dielectric adhesives, screen-printable flexible thermosetting dielectric adhesives, photo-etchable flexible thermosetting dielectric adhesive, flexible hydrophobic dielectric adhesives using non-polar hydrophobic polymer carrier medium.

The amalgams used in the present invention are preferably the metallic amalgams that have been used as interconnect material in the microelectronics packaging industry. An amalgam is defined as a non-equilibrium, mechanically alloyed material formed between a liquid metal and a powder. Amalgams in general have low processing temperatures, at or near room temperature, but when cured and hardened, yield materials with thermal stabilities well above room temperature, between 250 and 600° C. depending upon the materials. The liquid metals used in the present invention amalgams are typically mercury, gallium (melting point 30° C.), indium (melting point 259° C.), gallium/tin (melting point 16° C.), gallium/indium (melting point 15° C.), gallium/indium/tin (melting point 5° C.), gallium/aluminum, and other combinations with mercury, cadmium and bismuth. The powders are typically aluminum, aluminum nitride, antimony, cobalt, copper, chromium, germanium, gold, molybdenum, platinum, silicon carbide, iron, nickel, magnesium, manganese, silver, tungsten, tin, titanium, and vanadium. Various amalgams can be formed by the combinations of these liquid metals and powders.

The amalgam compositions may include additives such as oxides, ceramics, alumina, diamond, graphite, nitrides, phosphides, and sulfides for providing enhancements such as strength hardening, improved corrosion and wear resistance and surface active property. A volatile constituent, such as zinc or mercury, may be included to improve surface wetting of the powders. During curing, the amount of volatile additive can be reduced to control the properties of the reaction product.

The preferred amalgam of the present invention is a gallium alloy due to its wettability property to most metallic and oxide surfaces found in microelectronic applications and ability to form electrical contact. Further, bulk gallium alloy materials are mechanically strong and upon curing, have electrical and thermal properties comparable to solder.

The curing of gallium alloy can be performed at room temperature, or higher temperature depending on substrates. Preferably, curing is performed at about 130° C. for about sixteen hours using a convection oven. However, gallium alloy may be cured from room temperature to 200° C. Curing of gallium alloy amalgams can be accomplished at room temperature over a period of a few days, and can be accelerated to much shorter time (hours or minutes) by modest temperatures such as in the range of 100-200° C.

The invention is not limited to a single layer of interconnect on top of the chips. Because one starts with a highly planar surface, it is simple to add a dielectric layer on top of the first interconnect layer, and then a second interconnect layer. Thus the multilayer structures could be incorporated into the final substrate. Contact to these can be made through vias opened through the substrate. Either patterning such as photolithography and etching, or laser ablation (as is commonly used in the flex-circuit industry) can be used to form these vias, then generating the interconnect through these vias. Patterning techniques such as photolithography may be used, for example a conventional ultraviolet light exposure through a mask pattern followed by development. As another approach, a photoresist layer may be formed and patterned to produce an etch mask. In this case, wet etching in a basic solution or dry etching (plasma etching) may be used. As yet another patterning approach, the apertures may be formed in the polyimide layer by laser drilling or by plasma etching through a patterned photoresist layer.

The result of this invention is a flexible printed circuit product incorporating essentially any type of integrated circuit component in a flexible tape with robust, reliable interconnections capable of withstanding thermal cycling and mechanical shock as experienced in consumer use, and at a low cost because of the high-speed coating and laminating processes used.

What is claimed is:

1. A semiconductor packaging structure comprising
a first article comprising a first receiving surface, the first receiving surface comprising a plurality of raised contact pads;
a second article comprising a second receiving surface, the second receiving surface comprising a plurality of indented contact pads each having a recess, the indented contact pads locations corresponding to the locations of the raised contact pads, and the indented contact pads being larger than the raised contact pads; and
the indented and the raised contact pads being connected to provide a solid electrical connection with the first receiving surface in intimate contact with the second receiving surface, wherein the electrical connection is through a cured liquid or paste amalgam disposed in the recess of the indented contact pads.

2. A structure as in claim 1 wherein at least one of the receiving surfaces comprises an adhesive layer to improve the adhesion between the first and second articles.

3. A structure as in claim 1 wherein the contact pads have a lateral dimension, the lateral dimension being one micron or less than.

4. A structure as in claim 1 wherein the raised contact pads have a thickness in the range of 1 micron.

5. A structure as in claim 1 wherein the raised contact pads are made by selectively depositing a contact conducting material on a flat contact pad surface.

6. A structure as in claim 5 wherein the selective deposition is electroless deposition, selective chemical vapor deposition, conductive material printing, or by spatially selective irradiation of a conductive film following by selectively building up conductive material in the irradiated areas.

7. A structure as in claim 5 wherein the selective deposition is performed by spatially selective irradiation of a polymer film to expose a conductive layer, and following by selectively building up conductive material in the irradiated areas.

8. A structure as in claim 1 wherein the raised contact pads are made by blanketly depositing a contact conducting material and patterning the contact conducting material.

9. A structure as in claim 1 wherein the indented contact pads are made by coating a polymer layer over a conducting pad and opening a via through the polymer layer.

10. A structure as in claim 1 wherein the placing of the amalgam is by a controlled droplet dispensing technique or by an offset printing technique wherein a liquid is attracted by surface tension to a printing surface and transferred to the indented contact pads.

11. A structure as in claim 1 wherein at least one of the articles is a flexible substrate.

12. A structure as in claim 1 wherein the first article is a semiconductor chip.

13. A semiconductor packaging structure comprising
an article comprising a receiving surface, the receiving surface comprising a plurality of indented contact pads each having a recess, each recess containing a liquid or paste amalgam,
wherein the indented contact pads is connected to raised contact pads of another article to provide a solid electrical connection with a separation of one micron or less between the first and second articles, wherein the electrical connection is through curing the liquid or paste amalgam.

14. A semiconductor packaging structure comprising
a first article comprising a first receiving surface, the first receiving surface comprising a plurality of raised contact pads;
a second article comprising a second receiving surface, the second receiving surface comprising a plurality of indented contact pads each having a recess, the indented contact pads locations corresponding to the locations of the raised contact pads, and the indented contact pads being larger than the raised contact pads;
one or more spacers disposed between the first and second receiving surfaces, the thickness of the one or more spacers chosen to define a desired separation between the first and second articles of one micron or less; and
the indented and the raised contact pads being connected to provide a solid electrical connection with the desired separation between the first and second articles, wherein the electrical connection is through a cured liquid or paste amalgam disposed in the recess of the indented contact pads.

15. A structure as in claim 14 wherein at least one of the receiving surfaces comprises an adhesive layer to improve the adhesion between the first and second articles.

16. A structure as in claim 1 wherein the liquid or paste amalgam is cured at a temperature of 200 C or less.

17. A structure as in claim 1 wherein one of the first article and the second article comprise a plurality of raised or indented contact pads at the opposite surface of the receiving surface, and wherein the structure further comprises a third article having a plurality of indented or raised contact pads, matingly connected to provide a solid electrical connection with the corresponding raised or indented contact pads of the first or second article.

18. A structure as in claim 14 wherein the liquid or paste amalgam is cured at a temperature of 200 C or less.

19. A structure as in claim 14 wherein one of the first article and the second article comprise a plurality of raised or indented contact pads at the opposite surface of the receiving surface, and wherein the structure further comprises a third article having a plurality of indented or raised contact pads, matingly connected to provide a solid electrical connection with the corresponding raised or indented contact pads of the first or second article.

20. A structure as in claim 14 wherein the separation between the first and second articles is one micron or less and the lateral size of the contact pads is in the order of one micron.

* * * * *